United States Patent
Hung

(10) Patent No.: US 10,536,189 B2
(45) Date of Patent: Jan. 14, 2020

(54) METHOD FOR SIGNAL TRANSMISSION VIA AN ELECTRICAL POWER TRANSMISSION PATHWAY, AND SIGNAL TRANSMISSION SYSTEM USING THE SAME

(71) Applicant: AMTB Technology, Kaohsiung (TW)

(72) Inventor: Yu-Cheng Hung, Kaohsiung (TW)

(73) Assignee: AMTB TECHNOLOGY, Kaohsiung (TW)

( * ) Notice: Subject to any disclaimer, the term of this patent is extended or adjusted under 35 U.S.C. 154(b) by 155 days.

(21) Appl. No.: 15/962,482

(22) Filed: Apr. 25, 2018

(65) Prior Publication Data

US 2018/0323824 A1   Nov. 8, 2018

(30) Foreign Application Priority Data

May 2, 2017 (TW) .............................. 106114446 A

(51) Int. Cl.
| | | |
|---|---|---|
| *H04B 3/54* | (2006.01) | |
| *H04B 3/26* | (2006.01) | |
| *H01F 27/24* | (2006.01) | |
| *H03H 7/01* | (2006.01) | |

(52) U.S. Cl.
CPC ............... *H04B 3/26* (2013.01); *H01F 27/24* (2013.01); *H03H 7/0115* (2013.01); *H04B 3/54* (2013.01); *H04B 3/548* (2013.01); *H04B 2203/5491* (2013.01)

(58) Field of Classification Search
CPC . H04B 3/26; H04B 3/548; H04B 3/54; H04B 2203/5491; H03H 7/0115; H01F 27/24
See application file for complete search history.

(56) References Cited

U.S. PATENT DOCUMENTS

| | | | | |
|---|---|---|---|---|
| 5,747,981 A  * | 5/1998 | Callanan | ............... | H01F 38/023 323/362 |
| 7,170,367 B2 * | 1/2007 | Cern | ........................ | H01P 5/02 333/24 R |
| 2011/0222595 A1* | 9/2011 | Choi | ...................... | H04B 3/548 375/238 |
| 2015/0001922 A1* | 1/2015 | Poh | ..................... | H02J 13/0055 307/1 |
| 2016/0254756 A1* | 9/2016 | Yang | ...................... | H01F 30/12 363/21.02 |
| 2017/0063356 A1* | 3/2017 | Hung | ................... | H03K 5/1252 |

FOREIGN PATENT DOCUMENTS

CN           103457634 A   * 12/2013

* cited by examiner

*Primary Examiner* — Pinping Sun
(74) *Attorney, Agent, or Firm* — Hamre, Schumann, Mueller & Larson, P.C.

(57) ABSTRACT

A signal transmission system includes: a switch component, a first choke component, a first conductive path and a second choke component that are connected in series between a power wire and a load; a third choke component and a resonant circuit that are connected in series between another power wire and a common node of the switch component and the first choke component; a second conductive path connected between the load and a common node of the third choke component and the resonant circuit; and a control block. Under control of the control block, a magnetic core of each choke component reaches magnetic saturation when the switch component does not conduct, and operates at magnetic saturation when the switch component conducts.

12 Claims, 4 Drawing Sheets

METHOD FOR SIGNAL TRANSMISSION VIA AN ELECTRICAL POWER TRANSMISSION PATHWAY, AND SIGNAL TRANSMISSION SYSTEM USING THE SAME

CROSS-REFERENCE TO RELATED APPLICATION

This application claims priority of Taiwanese Patent Application No. 106114446, filed on May 2, 2017.

FIELD

The disclosure relates to signal transmission, and more particularly to a method for signal transmission via a path through which electrical power is transmitted, and to a signal transmission system using the same.

BACKGROUND

Power-line communication (PLC) techniques employ widely distributed electrical wiring to control electrical devices. However, conventional PLC techniques may have drawbacks such as poor compatibility with the electrical devices, high power consumption, and susceptibility to interference of noise and/or distortion from the electrical devices and long-distance transmission.

SUMMARY

Therefore, an object of the disclosure is to provide a method for signal transmission via an electrical power transmission pathway, and a signal transmission system using the same. The method can alleviate at least one of the drawbacks of the prior art.

According to an aspect of the disclosure, there is provided the method for signal transmission via an electrical power transmission pathway. The method includes: electrically connecting a switch component to one of a first power wire and a second power wire, the switch component being electrically connected to a first choke component in series, the first and second power wires cooperatively transmitting electrical power; building a first conductive path between the first choke component and a second choke component that is electrically connected to a load in series; electrically and respectively connecting a third choke component and a resonant circuit to the other one of the first and second power wires and a first common node of the switch component and the first choke component, the third choke component and the resonant circuit being electrically connected in series; building a second conductive path between the load and a second common node of the third choke component and the resonant circuit; and controlling the switch component to not conduct, and inducing an induced current that is related to a load control signal for controlling operation of the load, and that flows through at least the first choke component, the first conductive path, the second choke component, the second conductive path and the resonant circuit. Each of the first to third choke components includes a magnetic core, and the magnetic core of each of the first to third choke components has a magnetic hysteresis characteristic corresponding to a magnetic hysteresis curve such that: when the switch component does not conduct, the induced current does not cause the magnetic core of any of the first to third choke components to reach magnetic saturation; and when the switch component conducts, the electrical power induces a current that flows through the switch component, the first choke component, the first conductive path, the second choke component, the load, the second conductive path and the third choke component, and that causes the magnetic core of each of the first to third choke components to operate at magnetic saturation.

According to another aspect of the disclosure, the signal transmission system includes a switch component, a first choke component, a second choke component, a first conductive path, a third choke component, a resonant circuit, a second conductive path and a control block. The switch component and the first choke component are electrically connected in series. The switch component is used to be electrically connected further to one of a first power wire and a second power wire, receives a switch control signal, and operates between conduction and non-conduction based on the switch control signal. The first choke component includes a first magnetic core. The first and second power wires cooperatively transmit electrical power. The second choke component is used to be electrically connected to a load in series, and includes a second magnetic core. The first conductive path is electrically connected between and in series with the first and second choke components. The third choke component and the resonant circuit are electrically connected in series, and are electrically and respectively connected further to the other one of the first and second power wires and a first common node of the switch component and the first choke component. The third choke component includes a third magnetic core. The second conductive path is used to be electrically connected between the load and a second common node of the third choke component and the resonant circuit. The control block is electrically connected to the switch component, and generates the switch control signal for receipt by the switch component. When controlling the switch component to not conduct, the control block induces an induced current that is related to a load control signal for controlling operation of the load, and that flows through at least the first choke component, the first conductive path, the second choke component, the second conductive path and the resonant circuit. Each of the first to third magnetic cores has a magnetic hysteresis characteristic corresponding to a magnetic hysteresis curve such that: when the switch component does not conduct, the induced current does not cause any of the first to third magnetic cores to reach magnetic saturation; and when the switch component conducts, the electrical power induces a current that flows through the switch component, the first choke component, the first conductive path, the second choke component, the load, the second conductive path and the third choke component, and that causes each of the first to third magnetic cores to operate at magnetic saturation.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
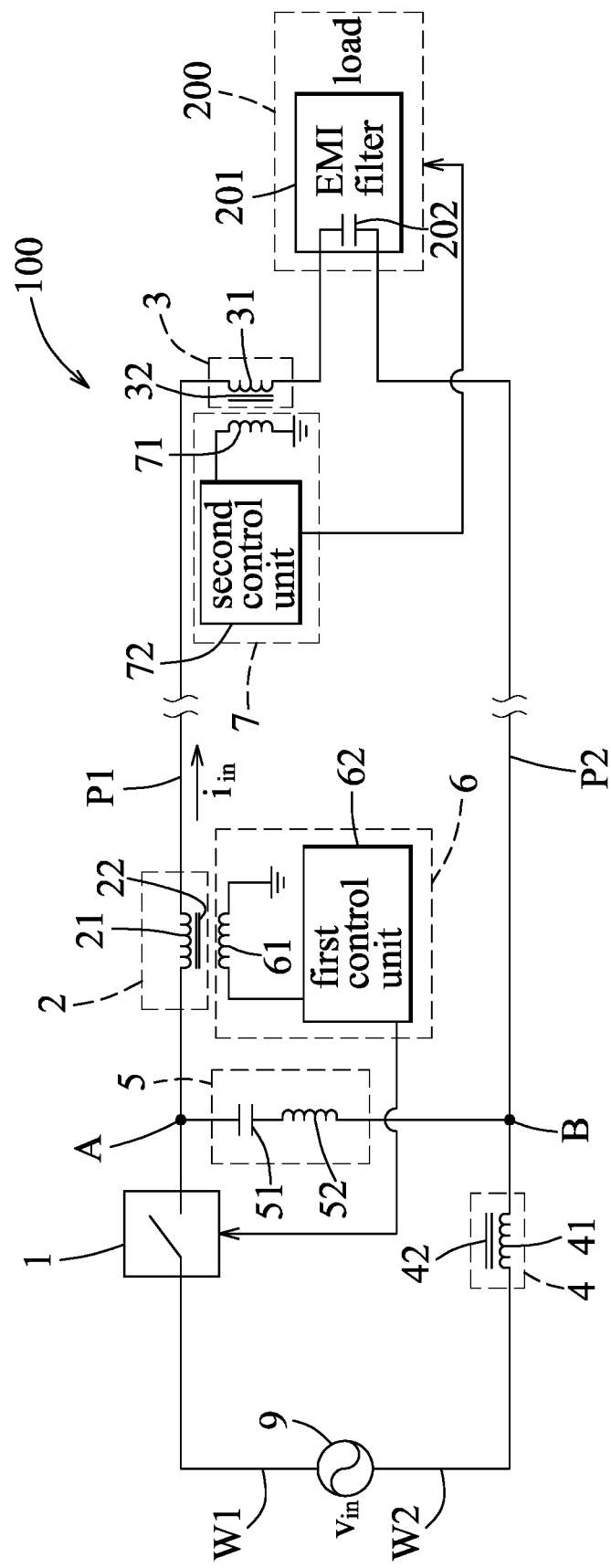
FIG. 1 is a circuit block diagram illustrating a first embodiment of a signal transmission system according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Moreover, it should be noted that throughout the disclosure, when two elements are described as being "coupled in series," "connected in series" or the like, it is merely intended to portray a serial connection between the two elements without necessarily implying that the currents flowing through the two elements are identical to each other and without limiting whether or not an additional element is coupled to a common node between the two elements. Essentially, "a series connection of elements," "a series coupling of elements" or the like as used throughout the disclosure should be interpreted as being such when looking at those elements alone.

Referring to FIG. 1, a first embodiment of a signal transmission system 100 according to the disclosure is used with a load 200 (e.g., an electrical device), and implements a method for signal transmission via an electrical power transmission pathway. In this embodiment, the signal transmission system 100 can transmit both alternating current (AC) electrical power, supplied by an AC power source 9 (e.g., a grid power source), and a load control signal to the load 200. However, the disclosure is not limited to such. In other embodiments, the signal transmission system 100 may transmit direct current (DC) electrical power to the load 200 instead. In addition, according to current industrial specifications, the electrical device serving as the load 200 generally has to include an electromagnetic interference (EMI) filter 201.

The signal transmission system 100 of this embodiment includes a switch component 1, a first choke component 2, a second choke component 3, a first conductive path (P1), a third choke component 4, a first resonant circuit 5, a second conductive path (P2), a first control block 6 and a second control block 7.

The switch component 1 is used to be electrically connected to one of a first power wire (W1) (e.g., a line wire) and a second power wire (W2) (e.g., a neutral wire), where the first and second power wires (W1, W2) cooperatively transmit the electrical power supplied by the AC power source 9. The switch component 1 receives a switch control signal, and operates between conduction and non-conduction based on the switch control signal. In this embodiment, the switch component 1 is electrically connected to the first power wire (W1), and may be a solid state relay with a current rating of around 20 A.

Figure 2:
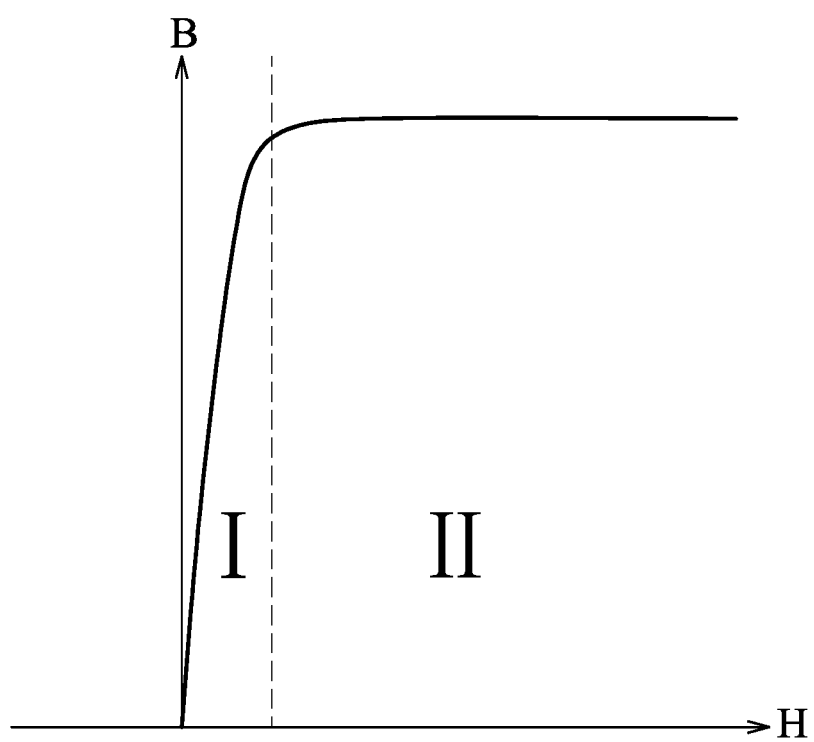
FIG. 2 is a plot illustrating a part of a magnetic hysteresis curve of each magnetic core of the first embodiment.

The first choke component 2 includes a first magnetic core 22, and a first coil 21 that is wound around the first magnetic core 22 and that is electrically connected to the switch component 1 in series. However, the disclosure is not limited to such. The first magnetic core 22 has a magnetic hysteresis characteristic corresponding to a magnetic hysteresis curve (i.e., a magnetic flux density (B) versus magnetic field intensity (H) curve). FIG. 2 illustrates a part of the magnetic hysteresis curve of the first magnetic core 22 having a non-saturation region (I) and a saturation region (II) that are separated by a dotted line. In this embodiment, the first choke component 2 may be a saturable reactor with the first magnetic core 22 having a high magnetic permeability (e.g., 20000H/m).

The second choke component 3 includes a second magnetic core 32 that has a magnetic hysteresis characteristic identical to that of the first magnetic core 22, and a second coil 31 that is wound around the second magnetic core 32 and that is used to be electrically connected to the EMI filter 201 in series.

The first conductive path (P1) (e.g., a first wire) is electrically connected between and in series with the first and second coils 21, 31.

The third choke component 4 includes a third magnetic core 42 that has a magnetic hysteresis characteristic identical to that of the first magnetic core 22, and a third coil 41 that is wound around the third magnetic core 42 and that is electrically connected to the other one of the first and second power wires (W1, W2). In this embodiment, the third coil 41 is electrically connected to the second power wire (W2).

The first resonant circuit 5 is electrically connected to the third coil 41 in series, and is electrically connected further to a first common node (A) (of the switch component 1 and the first coil 21). In this embodiment, the first resonant circuit 5 includes a capacitor 51 and an inductor 52 that are electrically connected in series between the first common node (A) and a second common node (B) (of the third coil 41 and the first resonant circuit 5), with the capacitor 51 connected to the first common node (A) and the inductor 52 connected to the second common node (B). However, the disclosure is not limited to such.

The second conductive path (P2) (e.g., a second wire) is used to be electrically connected between the second common node (B) and the EMI filter 201. It should be noted that the first and second conductive paths (P1, P2) need not be parallel to each other and need not have the same length, and can comply with practical layout conditions where the conductive path related to the line wire is generally longer than the conductive path related to the neutral wire.

Figure 3:
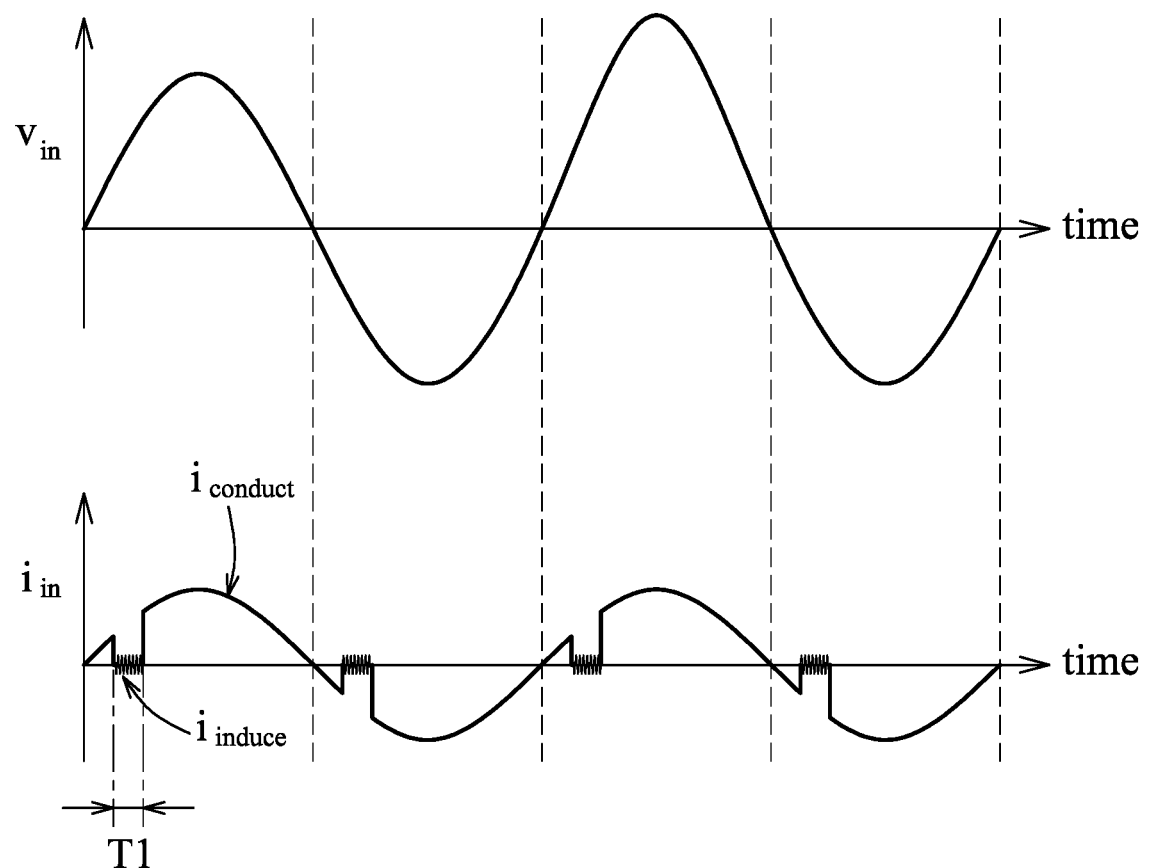
FIG. 3 is a timing diagram illustrating a voltage of electrical power and a current that flows through a first conductive path of the first embodiment.

Referring to FIGS. 1 and 3, the first control block 6 is electrically connected to the first and second power wires (W1, W2) to be powered by the electrical power supplied by the AC power source 9 (the connection of first control block 6 to the first and second power wires (W1, W2) is not depicted in FIG. 1). The first control block 6 is electrically connected further to the switch component 1, and generates the switch control signal for receipt by the switch component 1. The first control block 6 induces an induced current ($i_{induce}$) that is related to the load control signal and that flows through the first coil 21 when controlling the switch component 1 to not conduct (e.g., in a duration (T1)), and stops the induction of the induced current ($i_{induce}$) when controlling the switch component 1 to conduct.

In this embodiment, the first control block 6 includes a first inductor 61 that is coupled to the first coil 21, and a first control unit 62 that is electrically connected to the switch component 1 and the first inductor 61. The first inductor 61 cooperates with the first choke component 2 to form a first current controlled transformer. The first coil 21 permits a relatively large current to flow therethrough, and therefore can be viewed as a large current winding. The first inductor 61 is for processing carrier waves, and therefore can be viewed as a small power winding. The first control unit 62 generates the switch control signal for receipt by the switch component 1, provides a first current to the first inductor 61 based on the load 200 when controlling the switch component 1 to not conduct, and stops the provision of the first current when controlling the switch component 1 to conduct. The first current flows through the first inductor 61, and induces the first coil 21 to generate the induced current ($i_{induce}$) flowing therethrough. It should be noted that, since the first control block 6 induces the induced current ($i_{induce}$) when controlling the switch component 1 to not conduct, the electrical power supplied by the AC power source 9 does not provide a current flowing through the first coil 21 when the induced current ($i_{induce}$) is generated. In addition, the induced current ($i_{induce}$) is an alternating current (AC), and has a frequency equal to a resonant frequency of the first resonant circuit 5 (i.e., $1/2\pi\sqrt{LC}$, where L denotes an inductance of the inductor 52 and C denotes a capacitance of the capacitor 51). The induced current ($i_{induce}$) is relatively small in amplitude and relatively high in frequency as compared to a current ($i_{conduct}$) that is provided by the electrical power supplied by the AC power source 9 and flows through the first coil 21 when the switch component 1 conducts.

When the switch component 1 does not conduct, the induced current ($i_{induce}$) causes each of the first to third magnetic cores 22, 32, 42 to operate around an origin of the respective magnetic hysteresis curve (i.e., each of the first to third magnetic cores 22, 32, 42 does not reach magnetic saturation). Therefore, each of the first and second choke components 2, 3 operates in a normal transformer mode, and the third choke component 4 exhibits a high impedance. In addition, the first resonant circuit 5 exhibits a nearly zero impedance for the induced current ($i_{induce}$). As a consequence, the induced current ($i_{induce}$) flows in a loop cooperatively formed by the first coil 21, the first conductive path (P1), the second coil 31, a first stage filter capacitor 202 of the EMI filter 201, the second conductive path (P2) and the first resonant circuit 5, and does not leak to the second power wire (W2) through the third coil 41, thereby attaining relatively good signal quality.

When the switch component 1 does conduct, the electrical power supplied by the AC power source 9 provides the current ($i_{conduct}$) that flows through the switch component 1, the first coil 21, the first conductive path (P1), the second coil 31, the load 200, the second conductive path (P2) and the third coil 41. The current ($i_{conduct}$) causes each of the first to third magnetic cores 22, 32, 42 to generate a large magnetic field (i.e., each of the first to third magnetic cores 22, 32, 42 operates at magnetic saturation), thereby permitting passage of the electrical power supplied by the AC power source 9.

It should be noted that, in conventional PLC techniques, the load control signal must be transmitted around a zero-crossing point of a voltage ($v_{in}$) of the electrical power supplied by the AC power source 9 to achieve better signal quality, but the signal quality of the induced current ($i_{induce}$) in this embodiment can be ensured even if the duration (T1) where the switch component 1 does not conduct is not around the zero-crossing point of the voltage ($v_{in}$) (i.e., the switch component 1 is controlled to not conduct during a time period throughout which the voltage ($v_{in}$) is non-zero).

The second control block 7 is used to be electrically connected to the load 200, and generates the load control signal for receipt by the load 200 when the induced current ($i_{induce}$) flows through the second coil 31. The load 200 performs the operation based on the load control signal. In this embodiment, the second control block 7 includes a second inductor 71 and a second control unit 72. The second inductor 71 is coupled to the second coil 31, and cooperates with the second choke component 3 to form a second current controlled transformer. The second coil 31 permits a large current to flow therethrough, and therefore can be viewed as a large current winding. The second inductor 71 is for processing carrier waves, and therefore can be viewed as a small power winding. The second inductor 71 is induced by the induced current ($i_{induce}$) flowing through the second coil 31 to generate a second current flowing therethrough. The second control unit 72 is electrically connected to the second inductor 71, and is used to be electrically connected further to the load 200. The second control unit 72 may be powered by the load 200 (connection of the second control unit 72 to the load 200 for transmitting electrical power is not depicted in FIG. 1). The second control unit 72 generates, based on the second current, the load control signal for receipt by the load 200. Since the load control signal is generated based on the induced current ($i_{induce}$), and since the induced current ($i_{induce}$) has relatively good signal quality, the load control signal has relatively good signal quality as well.

In an example, when the switch component 1 conducts, each of the first to third coils 21, 31, 41 has a nearly zero inductance, and when the switch component 1 does not conduct, each of the first and second current controlled transformers is a nearly ideal transformer, and the third coil 41 has the inductance of several milli-henries (mH).

In application, each of the second choke component 3 and the second control block 7 can be designed to have a small size. Therefore, the second choke component 3 and the second control block 7 occupy little space and can be installed in a socket outlet (not shown), into which a power plug (not shown) of the load 200 can be plugged. However, the disclosure is not limited to such.

Figure 4:
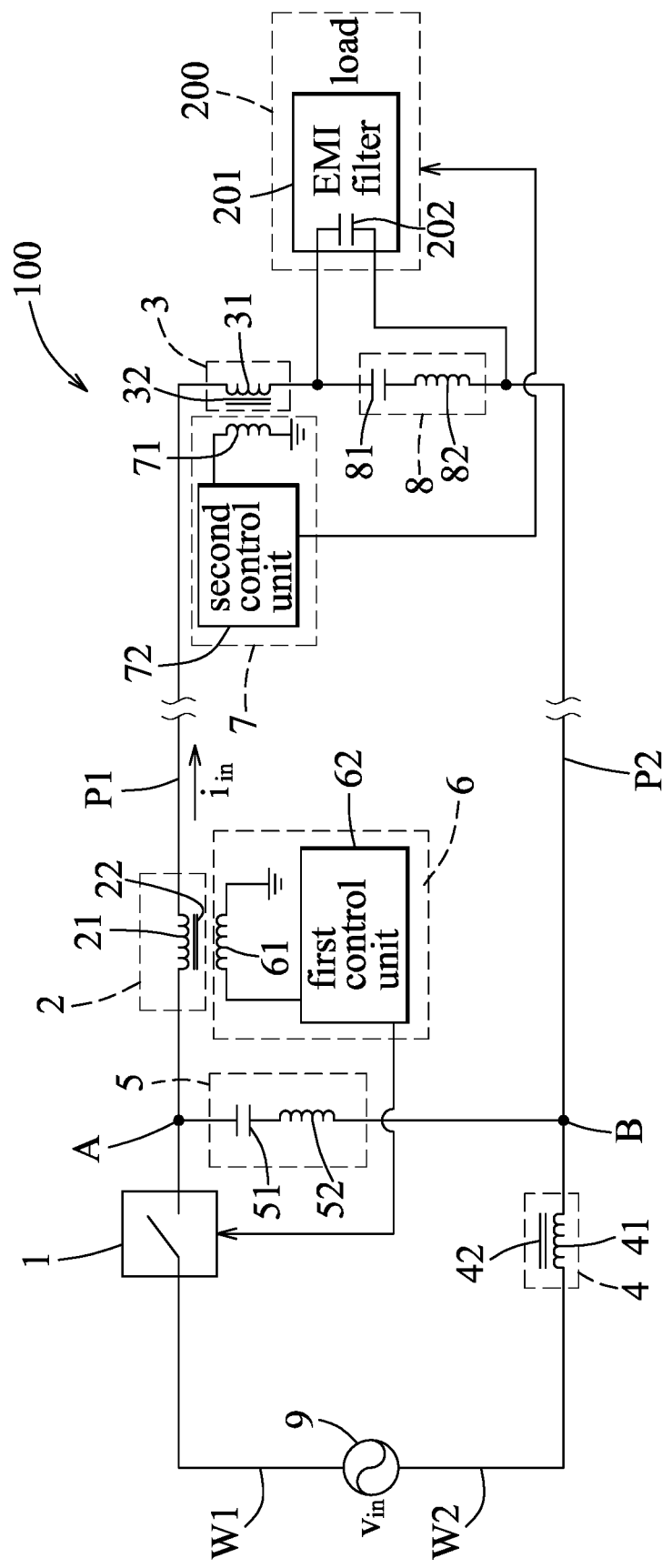
FIG. 4 is a circuit block diagram illustrating a second embodiment of the signal transmission system according to the disclosure.

Referring to FIG. 4, a second embodiment of the signal transmission system 100 according to the disclosure is a modification of the first embodiment, and differs from the first embodiment in that the signal transmission system 100 is used further with at least one other load (not shown) electrically connected to the load 200 in parallel, and that the signal transmission system 100 further includes a second resonant circuit 8 electrically connected between the second coil 31 and the second conductive path (P2) and to the load 200 in parallel.

In the second embodiment, the second resonant circuit 8 includes a capacitor 81 and an inductor 82 that are electrically connected in series between the second coil 31 and the second conductive path (P2), with the capacitor 81 connected to the second coil 31 and the inductor 82 connected to the second conductive path (P2). However, the disclosure is not limited to such. The second resonant circuit 8 has a resonant frequency equal to that of the first resonant circuit 5. The second resonant circuit 8 exhibits a nearly zero impedance for the induced current ($i_{induce}$), and therefore the induced current ($i_{induce}$) flows through the nearly short circuited second resonant circuit 8, instead of the first stage filter capacitor 202 and the at least one other load, thereby reducing (e.g., minimizing) distortion and leakage of the induced current ($i_{induce}$).

In view of the above, each of the aforesaid embodiments has the following advantages:

1. Since the load control signal is transmitted using the induced current ($i_{induce}$), and since the switch component 1, the first to third choke components 2-4 and the first resonant circuit 5 are relatively simple, the signal transmission system 100 can achieve relatively good signal quality at a relatively low cost.

2. Since the load control signal is transmitted using the induced current ($i_{induce}$), the first and second conductive paths (P1, P2) need not be parallel to each other and need not have the same length, and can comply with the practical layout conditions. In addition, the signal transmission system 100 does not require any impedance-matching circuit to alleviate problems related to uneven or long lengths of the first and second conductive paths (P1, P2).

3. When the second resonant circuit 8 is used, distortion and leakage of the induced current ($i_{induce}$) can be reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A method for signal transmission via an electrical power transmission pathway, said method comprising:
   electrically connecting a switch component to one of a first power wire and a second power wire, the switch component being electrically connected to a first choke component in series, the first and second power wires cooperatively transmitting electrical power;
   building a first conductive path between the first choke component and a second choke component that is electrically connected to a load in series;
   electrically and respectively connecting a third choke component and a first resonant circuit to the other one of the first and second power wires and a first common node of the switch component and the first choke component, the third choke component and the first resonant circuit being electrically connected in series;
   building a second conductive path between the load and a second common node of the third choke component and the first resonant circuit; and
   controlling the switch component to not conduct, and inducing an induced current that is related to a load control signal for controlling operation of the load, and that flows through at least the first choke component, the first conductive path, the second choke component, the second conductive path and the first resonant circuit;
   wherein each of the first to third choke components includes a magnetic core, and the magnetic core of each of the first to third choke components has a magnetic hysteresis characteristic corresponding to a magnetic hysteresis curve such that: when the switch component does not conduct, the induced current does not cause the magnetic core of any of the first to third choke components to reach magnetic saturation; and when the switch component conducts, the electrical power provides a current that flows through the switch component, the first choke component, the first conductive path, the second choke component, the load, the second conductive path and the third choke component, and that causes the magnetic core of each of the first to third choke components to operate at magnetic saturation.

2. The method of claim 1, wherein the induced current is an alternating current (AC), and has a frequency equal to a resonant frequency of the first resonant circuit.

3. The method of claim 2, further comprising:
   electrically connecting a second resonant circuit between the second choke component and the second conductive path and to the load in parallel, the second resonant circuit having a resonant frequency equal to that of the first resonant circuit;
   wherein the induced current further flows through the second resonant circuit.

4. The method of claim 1, further comprising:
   controlling the switch component to conduct, and stopping the induction of the induced current.

5. A signal transmission system comprising:
   a switch component and a first choke component that are electrically connected in series, said switch component being used to be electrically connected further to one of a first power wire and a second power wire, receiving a switch control signal, and operating between conduction and non-conduction based on the switch control signal, said first choke component including a first magnetic core, the first and second power wires cooperatively transmitting electrical power;
   a second choke component used to be electrically connected to a load in series, and including a second magnetic core;
   a first conductive path electrically connected between and in series with said first and second choke components;
   a third choke component and a first resonant circuit that are electrically connected in series, and that are electrically and respectively connected further to the other one of the first and second power wires and a first common node of said switch component and said first choke component, said third choke component including a third magnetic core;
   a second conductive path used to be electrically connected between the load and a second common node of said third choke component and said first resonant circuit; and
   a first control block electrically connected to said switch component, and generating the switch control signal for receipt by said switch component; when controlling said switch component to not conduct, said first control block inducing an induced current that is related to a load control signal for controlling operation of the load, and that flows through at least said first choke component, said first conductive path, said second choke component, said second conductive path and said first resonant circuit;
   wherein each of said first to third magnetic cores has a magnetic hysteresis characteristic corresponding to a magnetic hysteresis curve such that: when said switch component does not conduct, the induced current does not cause any of said first to third magnetic cores to reach magnetic saturation; and when said switch component conducts, the electrical power provides a current that flows through said switch component, said first choke component, said first conductive path, said second choke component, the load, said second conductive path and said third choke component, and that causes each of said first to third magnetic cores to operate at magnetic saturation.

6. The signal transmission system of claim 5, further comprising:
a second control block used to be electrically connected to the load, and generating the load control signal for receipt by the load when the induced current flows through said second choke component.

7. The signal transmission system of claim 6, wherein:
said first control block includes a first inductor that is coupled to said first choke component, and a first control unit that is electrically connected to said switch component and said first inductor, said first control unit generating the switch control signal for receipt by said switch component, and generating a first current for receipt by said first inductor when controlling said switch component to not conduct, the first current flowing through said first inductor, and inducing said first choke component to generate the induced current flowing therethrough; and
said second control block includes a second inductor that is coupled to said second choke component, and a second control unit that is electrically connected to said second inductor, and that is used to be electrically connected further to the load, said second inductor being induced by the induced current flowing through said second choke component to generate a second current flowing therethrough, said second control unit generating, based on the second current, the load control signal for receipt by the load.

8. The signal transmission system of claim 5, wherein the induced current is an alternating current (AC), and has a frequency equal to a resonant frequency of said first resonant circuit.

9. The signal transmission system of claim 8, the load including an electromagnetic interference (EMI) filter electrically connected between said second choke component and said second conductive path, wherein the induced current further flows through a first stage filter capacitor of the EMI filter.

10. The signal transmission system of claim 8, further comprising:
a second resonant circuit electrically connected between said second choke component and said second conductive path and to the load in parallel, and has a resonant frequency equal to that of said first resonant circuit;
wherein the induced current further flows through said second resonant circuit.

11. The signal transmission system of claim 10, wherein each of said first and second resonant circuits includes a capacitor and an inductor that are electrically connected in series.

12. The signal transmission system of claim 5, wherein said first control block further stops the induction of the induced current when controlling said switch component to conduct.

* * * * *